United States Patent [19]
Glas et al.

[11] Patent Number: 6,049,248
[45] Date of Patent: Apr. 11, 2000

[54] METHOD AND APPARATUS FOR GENERATING A DRIVER SIGNAL FOR USE BY A NON-LINEAR CLASS S AMPLIFIER FOR PRODUCING LINEAR AMPLIFICATION

[75] Inventors: Jack Glas; Hongmo Wang, both of Somerset, N.J.

[73] Assignee: Lucent Technologies Inc., Murray Hill, N.J.

[21] Appl. No.: 09/220,980

[22] Filed: Dec. 23, 1998

[51] Int. Cl.[7] ...................................................... H03F 3/38
[52] U.S. Cl. ......................... 330/10; 330/207 A; 375/238
[58] Field of Search ................................. 330/10, 207 A, 330/251; 375/238, 315, 317

[56] References Cited

U.S. PATENT DOCUMENTS

| | | | |
|---|---|---|---|
| 3,896,395 | 7/1975 | Cox | 330/53 |
| 4,004,246 | 1/1977 | Hamada | 330/10 |
| 5,535,438 | 7/1996 | Sevic | 455/110 |
| 5,847,602 | 12/1998 | Su | 330/10 |

*Primary Examiner*—Robert Pascal
*Assistant Examiner*—Henry Choe

[57] ABSTRACT

A circuit for receiving an input signal having a phase component and an amplitude component which carry information, and for producing an output driver signal containing the phase and amplitude component information for driving a non-linear amplifier for generating linear amplification. The circuit includes a voltage controlled oscillator for receiving the phase component and for outputting a phase modulated carrier signal having a duty cycle and a constant amplitude. A driver stage made from a plurality of invertors, each having a pair of MOSFET transistors, receives the carrier signal at the gate terminals of the transistors. The amplitude component is used to drive the invertors by applying the amplitude component to the back-gate terminals of at least some of the transistors in the invertors to pulse width modulate the carrier signal. The resulting output signal containing both phase component information and amplitude component information can then be used to drive a non-linear Class S amplifier to generate linear amplification while achieving high efficiency.

5 Claims, 1 Drawing Sheet

METHOD AND APPARATUS FOR GENERATING A DRIVER SIGNAL FOR USE BY A NON-LINEAR CLASS S AMPLIFIER FOR PRODUCING LINEAR AMPLIFICATION

BACKGROUND OF THE INVENTION

1. Field of the Invention

The present invention relates to a linear transmitter for providing amplitude and phase modulation to an input signal. More particularly, the present invention pertains to a device and method for generating a driver signal for driving a non-linear amplifier and for producing linear amplification.

2. Description of the Related Art

Many modulation schemes for transmitting modulated phase and modulated amplitude components of an input signal in communications systems are known. In some schemes, linear transmitters employing linear amplifiers are used because such amplifiers preserve the phase and amplitude components of the input signal and, consequently, the data contained therein. The drawback of using linear amplifiers, however, is the low power efficiency associated with such amplifiers. Other prior art schemes attempt to simulate linear transmitter performance using non-linear amplifiers so as to benefit from the higher power efficiency that non-linear amplifiers exhibit. The problem with these alternate schemes is that although non-linear amplifiers exhibit increased power efficiency over linear amplifiers, they lose or distort amplitude information carried by the amplitude component of the input signal.

In an attempt to compensate for or prevent amplitude loss in the use of non-linear amplifiers, some prior art systems isolate the phase and amplitude components from each other and the phase component is then used to drive a voltage controlled oscillator (VCO) to produce a phase modulated VCO signal. Techniques are then used to incorporate or otherwise add the amplified amplitude component to the amplified phase component. The particular amplitude incorporation technique will vary depending on the type of non-linear amplifier used, e.g. a Class C amplifier or a Class D amplifier will employ a switching mechanism for switching amplifiers in and out of an amplifier array, or other amplitude restoration techniques to restore lost or distorted amplitude information. Although such techniques exist for Class C and Class D amplifiers, no simple techniques presently exist which allow for the use of highly efficient Class S amplifiers in a linear transmitter so as to permit the incorporation of amplitude information into an existing phase modulated signal.

SUMMARY OF THE INVENTION

In accordance with the present invention, a circuit is disclosed which provides for modulation of a phase component and an amplitude component of an input signal for driving a non-linear Class S CMOS amplifier to generate linear amplification. A decomposer is used for separating the phase and amplitude components of an input signal. The inventive circuit includes a voltage controlled oscillator (VCO) and a driver stage. The phase component is used to phase modulate the VCO to produce a phase-modulated carrier signal. The phase modulated carrier signal is input to the driver stage to produce an output signal which can then be used to drive a Class S amplifier. Each driver stage contains an invertor having at least a pair of MOSFET transistors, with each transistor having a gate terminal and a backgate terminal. The carrier signal is input to one or more of these subject drivers at the gate terminals thereof. The amplitude component is provided to the backgate terminals of the transistors in the subject drivers for adjusting the threshold voltages of the transistors and hence, the invertors in the subject drivers to pulse width modulate the carrier signal. In this manner, amplitude information in the form of variations in the width of pulses of the carrier signal can be included in an output signal and used to drive a non-linear Class S amplifier.

A method of modulating phase and amplitude components of an input signal for driving a non-linear Class S amplifiers is also disclosed. The method decomposes the input signal to separate it into the phase and amplitude components and phase modulates a VCO with the phase component to produce a phase-modulated carrier signal. This resulting signal is then provided as an input to a gate terminal of a select MOSFET transistor in a driver stage and is pulse width modulated by applying the amplitude component to the backgate terminal of the select transistor.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference numerals denote similar elements throughout the several views.

DESCRIPTION OF THE PRESENTLY PREFERRED EMBODIMENTS

Figure 1:
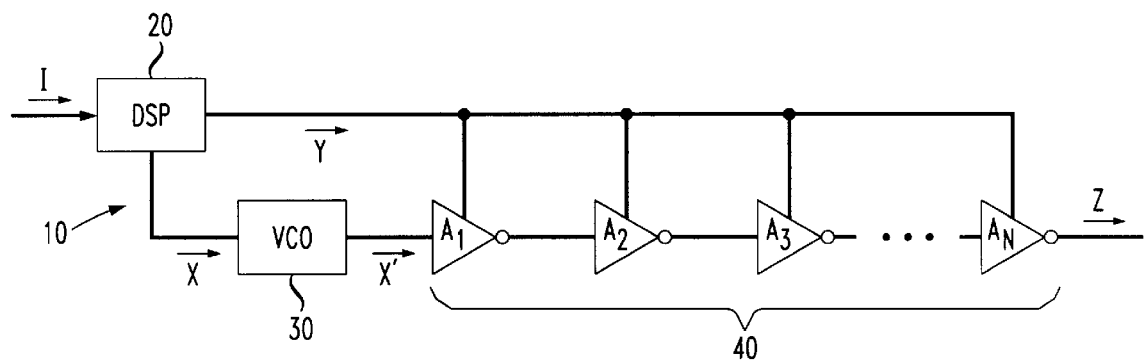
FIG. 1 is a block diagram of a modulator circuit in accordance with the present invention.

A block representation of a modulator circuit 10 in accordance with a preferred embodiment of the present invention is shown in FIG. 1. The modulator circuit includes a voltage controlled oscillator (VCO) 30 and a driver section 40. An input signal I is decomposed into a phase component (X) having a constant amplitude, and an amplitude component (Y) having a constant phase. The decomposing of the input signal can be readily accomplished by using known digital signal processing techniques as is known by those having ordinary skill in the art.

Once the input signal is decomposed, the phase component X is used to drive the VCO 30. As a result, VCO 30 outputs a signal X' which is a phase modulated carrier signal having a constant amplitude. The signal X' contains data carried by the phase component X of the input signal and is then provided as an input to the driver stage 40.

As shown, driver stage 40 includes a plurality of driver stages $40_1$–$40_N$ made up of variable threshold invertors with each driver having a threshold value and a gain value, e.g. driver stage $40_1$ has gain $A_1$, driver stage $40_2$ has gain $A_2$, etc. The driver stages are arranged in any manner to provide increasing power to the carrier signal. For example, driver stage $40_1$ amplifies signal X' by gain $A_1$, driver $40_2$ amplifies the resulting signal output from driver $40_1$ by gain $A_2$, etc., such that the power of signal X' is greater at the output of driver $40_2$ than the power of signal X' at the output of driver $40_1$.

As stated above, signal X' is a phase modulated signal having a constant amplitude and which contains information from the phase component X of the input signal I. Information carried by the amplitude component Y of the input signal must then be incorporated into a resulting output signal Z without affecting signal X', i.e. without contaminating the information carried by the phase component of the input signal. This is accomplished, as explained more fully below, by applying the amplitude component Y to one or more of the drivers 40 to pulse width modulate signal X' and thereby incorporate amplitude component information into the output signal in the form of variations to the widths of pulses in signal Z. Signal Z can then be used to drive a non-linear Class S amplifier and generate linear amplification without utilizing linear amplifiers.

Figure 2:
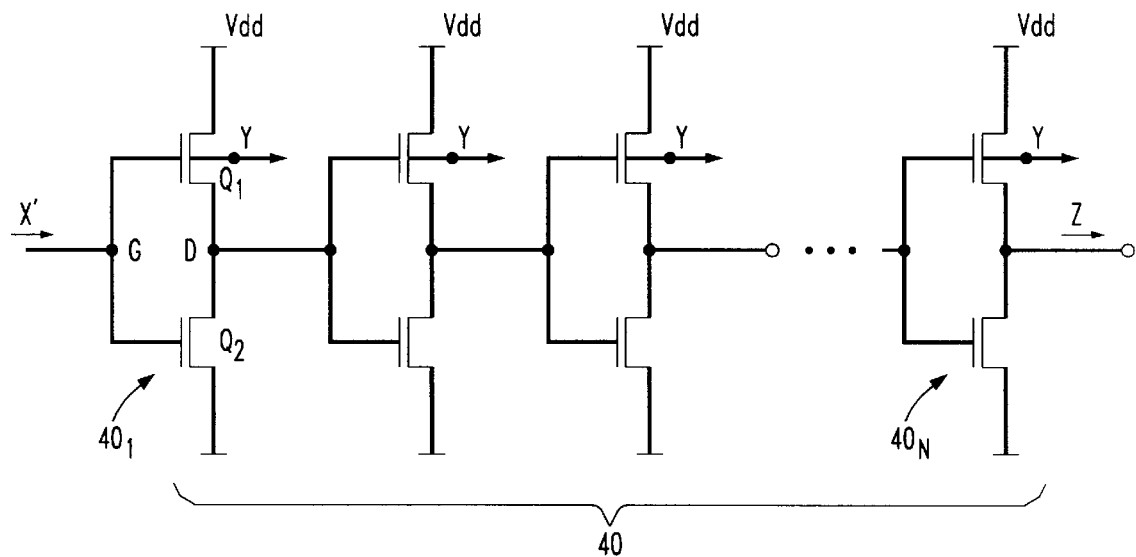
FIG. 2 is a schematic diagram of the driver section of the circuit of FIG. 1.

As stated above, each driver 40 is essentially an inverter which outputs a signal having a duty cycle or sequence of pulses containing a series of alternating "on" and "off" pulses having a particular width. Each amplifier includes a pair of MOSFET transistors as shown in FIG. 2. For example, driver 40, includes transistor pair $Q_1$, $Q_2$ and driver $40_N$ includes transistor pair $Q_{1N}$, $Q_{2N}$. Each transistor Q has a source terminal, a drain terminal, a gate terminal and a backgate terminal and each transistor pair is configured so that an input signal is applied to the gate terminals of the transistor pair and an output signal is output from the drain terminals of the transistor pair, as shown in FIG. 2.

It is known that the output power of an invertor is proportional to the length of time that the amplifier remains "on". In other words, the output power is proportional to the width of the "on" pulses in the amplifier output signal duty cycle. It is also known that the threshold voltage of a MOSFET transistor is a fixed value when the backgate terminal of the transistor is tied to a fixed voltage but that the threshold voltage can be changed by applying a voltage to the transistor backgate terminal. In other words, by applying an appropriate voltage to the backgate terminal of a MOSFET, the threshold or turn-on voltage of the transistor can be decreased, to facilitate turn-on, or increased to prevent turn-on.

Utilizing these principles of a MOSFET transistor, and with continued reference to FIG. 2, the amplitude component Y can be used as a control signal for the drivers. By doing so, the drivers are simultaneously being used as pulse width modulators which will change the pulse widths of the phase modulated carrier signal by the amplitude component. In particular, amplitude component Y is applied to one or both transistors $Q_1$, $Q_2$ in one or more amplifier drivers ($40_1$, $40_2$, etc.) to vary the threshold voltage of the transistors to which the component Y is applied. This, in turn, facilitates turn-on and turn-off of those particular transistors in accordance with the information contained in the amplitude component Y, thereby varying the widths of the duty cycle pulses of the output signal Z in proportion to the information contained in the amplitude component Y. In this manner, and in accordance with the invention, the amplitude information contained in the amplitude component Y of the input signal I can be incorporated into the output signal Z without adversely affecting information contained in the phase component X. Signal Z can then be used to drive a non-linear Class S amplifier, which will produce linear amplification.

Thus, while there have shown and described and pointed out fundamental novel features of the invention as applied to preferred embodiments thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. It is the intention, therefore, to be limited only as indicated by the scope of the claims appended hereto.

We claim:

1. A circuit for generating, from an input signal having information contained in a phase component and an amplitude component, a driver signal for driving a non-linear amplifier for generating linear amplification, comprising:
    a voltage controlled oscillator for receiving the phase component of the input signal and for outputting a phase modulated carrier signal containing the phase component information, said carrier signal having a series of pulses having corresponding pulse widths; and
    a driver stage for receiving and amplifying said carrier signal, said driver stage comprising an inverter having a threshold voltage value and including a pair of MOSFET transistors, each said transistor having a gate terminal, a drain terminal, a source terminal, and a backgate terminal, said transistor pair being configured for receiving said carrier signal at said gate terminals and for receiving, at a backgate terminal of at least one of the transistors in said transistor pair, said amplitude component so that the threshold voltage of the inverter is varied in accordance with the amplitude component for adjusting the pulse widths of the series of pulses in said carrier signal for producing a pulse width modulated output signal containing phase and amplitude component information.

2. The circuit of claim 1, wherein said driver stage further comprises a plurality of inverters and wherein each inverter receives the amplitude component at a backgate terminal of one of the transistors of the transistor pair of said each inverter.

3. The circuit of claim 1, wherein said pair of transistors comprises a PMOS transistor and an NMOS transistor, and wherein the amplitude component is applied to the backgate terminal of the PMOS transistor.

4. A method of generating, from an input signal having information contained in a phase component and an amplitude component, a driver signal for driving a non-linear amplifier for producing linear amplification so that information contained in the phase component is not disturbed by the amplitude component, comprising the steps of:
    separating the phase component from the amplitude component;
    providing the phase component to a voltage controlled oscillator for forming a phase modulated carrier signal having a substantially constant amplitude containing phase component information, said carrier signal having a series of pulses with corresponding pulse widths;
    driving, with the amplitude component, a driver stage comprising an inverter having a threshold voltage value and which receives the carrier signal as an input, said driver including a pair of MOSFET transistors, each said transistor having a gate terminal, a drain terminal, a source terminal, and a backgate terminal, said transistor pair being configured for receiving said signal at said gate terminals and for receiving, at a backgate terminal of at least one of the transistors of said transistor pair, the amplitude component so that the threshold voltage of said inverter is varied in accordance with the amplitude component for adjusting the pulse widths of the pulses in said carrier signal for producing a pulse width modulated output signal containing phase and amplitude component information.

5. The method of claim 4, wherein said driver stage comprises a plurality of drivers, said method further comprising the step of driving at least some of said drivers with the amplitude component.

* * * * *